(12) United States Patent
Devanney

(10) Patent No.: US 6,191,641 B1
(45) Date of Patent: Feb. 20, 2001

(54) ZERO POWER FUSE CIRCUIT USING SUBTHRESHOLD CONDUCTION

(75) Inventor: William L. Devanney, Menlo Park, CA (US)

(73) Assignee: Clear Logic, Inc., San Jose, CA (US)

( * ) Notice: Under 35 U.S.C. 154(b), the term of this patent shall be extended for 0 days.

(21) Appl. No.: 09/255,967

(22) Filed: Feb. 23, 1999

(51) Int. Cl.[7] .................................................. H01H 37/76
(52) U.S. Cl. ............................ 327/525; 327/143; 327/198
(58) Field of Search .................................. 327/143, 198, 327/525, 96; 365/225.7, 96

(56) References Cited

U.S. PATENT DOCUMENTS

| | | | |
|---|---|---|---|
| 4,476,546 | * 10/1984 | Varshney | 365/200 |
| 4,730,129 | * 3/1988 | Kunitoki et al. | 307/362 |
| 4,837,570 | 6/1989 | Molfetta et al. | 340/984 |
| 5,457,656 | * 10/1995 | Fu | 365/200 |
| 5,731,734 | 3/1998 | Pathak et al. | 327/525 |

FOREIGN PATENT DOCUMENTS 4-49713 * 2/1992 (JP) .............................. H03K/19/00

* cited by examiner

Primary Examiner—Toan Tran
Assistant Examiner—Linh Nguyen
(74) Attorney, Agent, or Firm—Skjerven Morrill MacPherson LLP; Tom Chen

(57) ABSTRACT

A zero static power laser fuse circuit is formed from one laser fuse and three transistors, with the fuse connected in series to a reverse-biased diode and with the common node of the fuse and diode connected to the input of a driving circuit, such as a CMOS inverter. Blowing the fuse allows a small subthreshold conduction current to flow to the common node and pull the node to the opposite logic state. This fuse circuit, which allows the capacitance at the common node to be minimized for zero static power operation, requires less circuit area than previous zero static power fuse circuits.

26 Claims, 3 Drawing Sheets

ZERO POWER FUSE CIRCUIT USING SUBTHRESHOLD CONDUCTION

BACKGROUND

1. Field of the Invention

This invention relates generally to fuse circuits, and in particular to laser fuse circuits dissipating zero static power.

2. Description of Related Art

Due to the ever-increasing number of applications and uses for integrated circuits, two major objectives for IC manufacturers are the ability to customize circuits for specific uses and the ability to manufacture these circuits at lowest cost. One method of customizing or configuring circuits is to utilize laser fuses to alter the structure, path, or electrical characteristics of the semiconductor device. This is of use in both moderately configurable devices such as full-custom ICs with laser enabled operating modes, or in highly configurable devices such as laser fuse-based gate arrays where the entire function of the device can be altered by lasering. Laser fuses are also used in various repair schemes which improve yields and thus reduce unit costs. In particular, fuses have been used to repair non-functional devices through the selective deletion of defective portions of the circuitry and the substitution of functional redundant circuitry for the defective portions of the circuitry, thus reclaiming failing ICs as good devices.

Laser fuses are typically made from either metal or polysilicon material. The fuses are disconnected (blown) by irradiating the selected fuse with a targeting energy beam, hereinafter generally referred to as a laser. To improve fuse blowing dynamics, it is also common for the fuse to be covered by an insulating layer of silicon oxide, silicon nitride, or other insulating materials, which are applied as inter-conductive dielectric layers, and/or as part of a final passivation layer to protect the device from moisture and scratches.

The fuse disconnection occurs when the fuse body is heated by the laser, resulting in a change in the fuse material from a solid state to a vaporized or partially vaporized state. The insulation layer covering the fuse serves as a bomb vessel enclosure which momentarily contains the fuse material and prevents premature splattering or melting; the containment of the fuse material results in a more complete and uniform vaporization of the fuse material. The resulting pressure from the vaporization of the fuse causes the overlying insulation to be "blown open" or rupture, blowing the fuse material out of the cavity and thereby completing the desired disconnection. However, in some situations, the fuse is poorly blown. FIGS. 1A and 1B illustrate the case of an incompletely or poorly blown fuse. FIG. 1A shows a top view of a laser-configured fuse 100 formed on and covered with a layer of insulating material, such as a silicon oxide 110. Fuse 100 includes a fuse body 120 and two fuse terminals 130, which are connected to underlying circuit elements. Fuse body 120 is blown to sever the connection between the underlying elements, creating a disconnection hole 140 in the oxide 110. FIG. 1B is cross-sectional view of FIG. 1A along sectional lines A-A'. FIG. 1B shows a situation where the fuse blowing process results in an underblown fuse. Because the fuse body is not completely blown, a portion 150 of the fuse body may remain in the corner or other areas of the disconnect hole 140. If the portion 150 extends to both fuse terminals, an electrical connection between the fuse terminals still exists. A quick fuse clean-up etch is often employed to remove any residual fuse debris, such as portion 150, from the blown fuse cavity; unblown fuses are not attacked by this etch since they are still covered by the enclosing insulation layer.

Using techniques such as these, it is possible to implement highly manufacturable laser fuse processes, and indeed laser fuse circuits have found wide use in the semiconductor industry in products ranging from DRAMs to microprocessors.

While laser fuses provide useful methods to reducing cost and to customizing circuits quickly and flexibly, the laser fuses themselves are expensive circuit elements to deploy due to their relatively large size. The design rules used to lay out and place laser fuses are typically derived from the diameter of the laser beam that will be used to program the fuses. Given a large laser beam diameter, laser fuse layout dimensions must also be made large. In particular, nearby unrelated circuit elements must be spaced a safe distance away to avoid damage to these elements during lasering. Current laser systems provide beams with lateral dimensions that are approximately 5×—10× the dimensions achieved by current wafer photomasking equipment (the equipment used to pattern transistor elements). Consequently, laser fuse elements occupy correspondingly larger layout area and are significantly more costly than transistors, and the total area of a laser configuration circuit layout is predominantly a function of the number of laser fuses used in the circuit. Accordingly, in designing cost-effective circuits based on laser fuses, it is desirable to minimize the number of laser fuses required to implement a given function.

Furthermore, since fuse-based circuits are often replicated many times across an IC design, it is desirable that these fuse circuits dissipate minimum active power. Large ICs often have constrained maximum power budgets due to the limited heat dissipation capability of their packages, and any power dissipated by fuse-based circuits subtracts directly from the amount of other circuitry that can be placed in the IC.

Thus, it is desirable for laser fuse circuit schemes to utilize the minimum number of laser fuses possible (for cost reasons) and for the circuits to consume minimum static power (for power management reasons).

Zero static power fuse circuits (i.e., fuse circuits that operate with essentially no static power dissipation in both the blown and not-blown state) are known, such as disclosed in U.S. Pat. No. 4,613,959, entitled "Zero Power CMOS Redundancy Circuit" to Jiang and in U.S. Pat. No. 5,731,734, entitled "Zero Power Fuse Circuit" to Pathak et al. Note that "zero power" is an approximate term, as these circuits do dissipate tiny amounts of power through reverse-biased PN junction leakages and/or through transistor subthreshold conduction leakages, but these currents are considered negligible since they are so much smaller than normal operating currents. Jiang discloses a zero static power circuit that is created from two laser fuses and two transistors, while Pathak et al. disclose a zero static power circuit that is created from one laser fuse, three transistors, and a capacitor. Because laser fuses and capacitors occupy the majority of the area of a fuse circuit, it is desirable to have a zero static power laser fuse circuit with fewer laser fuses and capacitors than is the case with prior art laser fuse circuits.

SUMMARY

In accordance with the present invention, a zero static power fuse circuit utilizes one fuse and three transistors, thereby achieving reduced area as compared with conventional fuse circuits.

The fuse circuit includes a reverse-biased diode/fuse circuit comprising a fuse connected in series with a reverse-biased diode, and a driving circuit capable of driving an output node. The reverse-biased diode is implemented as a MOS transistor with the gate of the MOS transistor connected to its source such that the transistor is shut off and only conducts a small amount of subthreshold current. Configured this way, the transistor may be considered a two terminal device with the properties of a reverse-biased diode. One terminal of the reverse-biased diode is connected to one terminal of the fuse at a common node. This common node forms the input to the driver circuit. The non-common terminal of the fuse is connected to a first potential; the non-common terminal of the MOS transistor diode is connected to a second potential. The driving circuit, in one embodiment, is a CMOS inverter formed from one NMOS transistor and one PMOS transistor in series.

When the fuse in the diode/fuse circuit is blown, the small subthreshold conduction current pulls the input of the driving circuit toward one logic state (corresponding to the second potential), and when the fuse is not blown, the intact fuse pulls the input toward the other logic state (corresponding to the first potential). In both cases, zero static power is achieved by pulling the common node to substantially full CMOS levels (thus shutting off any current paths in the driver circuit).

In the blown fuse case, the subthreshold current of the reverse-biased MOS transistor must be designed to overcome any expected diffusion-to-substrate or diffusion-to-well junction leakages associated with the common node. This can be accomplished by means of the following design practices, used singularly or in combination. First, the MOS diode can be given greater subthreshold conduction strength by shortening its channel length, down to the minimum length allowed by the process design rules, hereinafter generally referred to as shortest channel length. This shortest channel length varies from process to process, depending largely on the capabilities of the lithography system used to pattern the transistors, as well as the doping profile used to minimize hot-electron and voltage breakdown effects. Second, the MOS diode can be given greater subthreshold conduction strength by increasing its channel width (the conduction strength being directly proportional to the width of the transistor). The channel can be widened until it is calculated that the subthreshold current sufficiently exceeds any expected common node junction leakages (both subthreshold current and junction leakage current can be estimated from the process characteristics of a given fabrication technology applied to the specific layout geometries of the circuit). Finally, junction leakage can be entirely precluded with a layout rule requiring that all diffusion regions which are connected to this common node be in wells or substrates that are biased to the same potential as the second potential.

These practices tend to improve the ratio of the MOS diode subthreshold current to the common node junction leakage and thus work to bring the common node voltage closer to the second potential in the blown fuse case. These practices also give the circuit increased tolerance to other less-quantifiable sources of leakage, such as any residual conduction paths along the walls of the blown fuse cavity.

Power consumption can also be reduced by additionally narrowing the channel width of the transistors in the driver circuit connected to the common node. This reduces current conduction in two ways. First, because conduction current is directly proportional to transistor width, narrower transistors have directly less current drive. Second, if the driver circuit transistors are made very narrow, then the narrow-channel threshold effects tend to increase the threshold voltage, making it easier to shut off the driver transistor.

As with prior art approaches, the present invention may consume non-zero power momentarily on power up. This is because both the common node and the output node are not immediately at full CMOS levels and the circuits they drive can conduct DC current when driven by non-CMOS levels. In the case of the present invention, this power consumption time is minimized by minimizing the capacitive load on the common node such that the subthreshold charging current is able to charge this node quickly to a full CMOS level. Thus, it is preferred that certain dimensions of the driver circuit transistors be minimized so as to reduce the capacitance on the common node. The capacitive load these transistors present to the common node may be considered as a combination of gate area capacitance (determined by the gate area of the transistors) and gate edge capacitance (determined by the lengths of the gate perimeters). Thus minimizing gate length and gate width of the transistors in the driver circuit tends to reduce the capacitive load on the common node, and thus shorten the transition time required to achieve zero power operation.

The present invention will be more fully understood upon consideration of the detailed description below, taken together with the accompanying drawings.

BRIEF DESCRIPTION OF THE DRAWINGS

Use of the same reference symbols in different figures indicates similar or identical elements.

DETAILED DESCRIPTION OF THE PREFERRED EMBODIMENTS

In accordance with the present invention, a zero static power laser fuse circuit is formed from one laser fuse and three transistors, which requires less circuit layout area to implement than previous zero static power fuse circuits.

Figure 2:
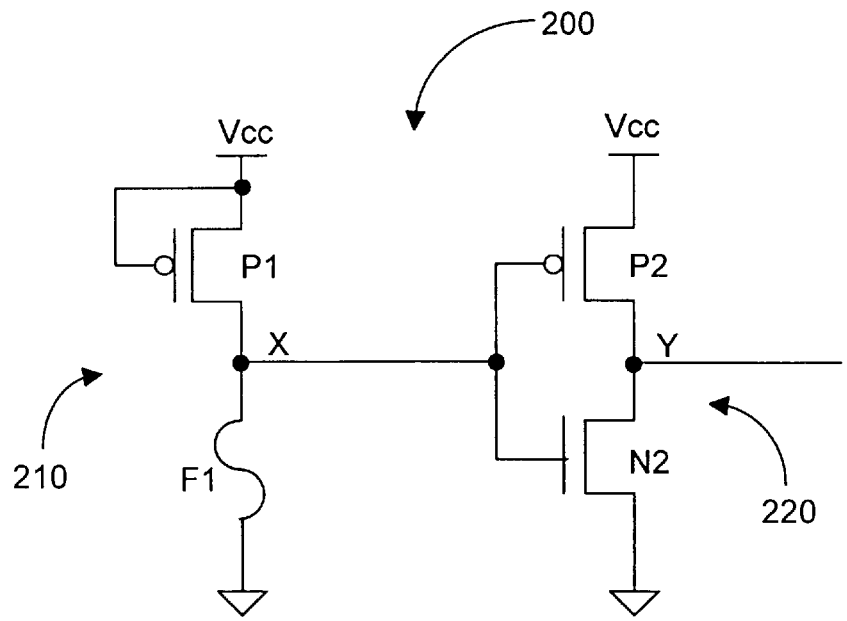
FIG. 2 is a diagram of a fuse circuit using a PMOS diode in accordance with one embodiment of the present invention.

FIG. 2 shows a fuse circuit 200 according to one embodiment of the present invention. Fuse circuit 200 includes a diode/fuse circuit 210 and a driving circuit, such as an inverter 220. Diode/fuse circuit 210 is formed by a p-channel or PMOS transistor P1 connected in series with a laser configurable fuse F1. The gate and source of PMOS transistor P1 are connected together to form a MOS diode. The gate and source of transistor P1 are coupled to a high first potential, such as supply voltage Vcc, which places PMOS transistor P1 in a reverse bias mode. In the reverse bias mode, only a small subthreshold conduction current flows through PMOS transistor P1. Subthreshold current is the current which flows in a transistor when the applied gate-to-source voltage is less than the transistor's threshold voltage. The threshold voltage may be defined as the applied gate-to-source voltage required to achieve a drain-to-source current flow of 100 nanoamps per micron width of transistor when the applied drain-to-source voltage is the intended supply voltage Vcc (typically 5V or 3.3V). The subthreshold current thus pulls a common connection node X toward the first potential (e.g., Vcc) if fuse F1 is blown. In addition, fuse F1 has one terminal connected to node X and the other terminal connected to a low second potential, such as ground. As a result, if fuse F1 remains intact, node X is pulled low toward the second potential (e.g., ground).

Inverter 220 inverts the value at node X and outputs the inverted value at an output node Y. Thus, when fuse F1 is blown, node X is high (or logic '1'), resulting in a low signal (or logic '0') at node Y. Similarly, when fuse F1 has not been blown, node X is low, resulting in node Y being high. Inverter 220 can be formed with two transistors, a PMOS transistor P2 and an NMOS transistor N2. The source of PMOS transistor P2 is coupled to a high potential (e.g., Vcc), the source of NMOS transistor N2 is coupled to a low potential (e.g., ground), the drains of PMOS transistor P2 and NMOS transistor N2 are commonly connected to output node Y, and the gates of PMOS transistor P2 and NMOS transistor N2 are commonly connected to input node X. When node X is at a high level (e.g., Vcc), PMOS transistor P2 is off, and NMOS transistor N2 is on, which pulls node Y down to a low level (e.g., ground). Similarly, when node X is at a low level (e.g., ground), NMOS transistor N2 is now off, and PMOS transistor P2 is on, which pulls node Y up to a high level (e.g., Vcc). This complementary MOS (CMOS) inverter draws very little current in steady state, with the current due primarily to leakage current across the transistor that is off. Consequently, power dissipation for the inverter is very low, typically much less than a nanowatt, this condition being commonly described as zero static power dissipation.

Thus, if fuse F1 remains intact, node X is quickly pulled down to a low level, which causes output node Y to be pulled up to a high level, and if fuse F1 is blown, the subthreshold current of PMOS transistor P1 will pull node X to a high level towards Vcc, which results in inverter 210 pulling output node Y down to a low level towards ground.

Zero static power operation is obtained by driving node X to substantially full CMOS logic levels as the input to the CMOS inverter 220. If fuse element F1 is intact, node X is readily grounded. However, if fuse element F1 is blown open, the subthreshold current of PMOS transistor P1 must be high enough to overcome any stray leakage current off node X and to pull node X to substantially Vcc in a reasonable amount of time, dependent on the application. To achieve this, the present invention allows a number of features to be optimized to meet this requirement, such as increasing the subthreshold current driving node X and/or reducing the capacitance at node X.

Increasing the pulling effect of the subthreshold current helps overcome any parasitic leakages affecting node X such as leakages across the blown fuse cavity or junction leakages, thereby allowing zero static power operation to be maintained.

The subthreshold current of PMOS transistor P1 is increased by shortening the channel length and/or increasing the channel width of P1. It is not necessary for the subthreshold current to pull node X completely to the second potential, only close enough to substantially prevent current flow in the driver circuit. This can be accomplished by shortening the channel of PMOS transistor P1, down to the minimum length allowed by the process design rules, referred to generally as shortest channel length. The subthreshold current can also be increased by increasing the channel width of PMOS transistor P1 to the degree required to overcome any expected leakages off node X, such as subthreshold current and junction current leakage. For example, typical channel widths of PMOS transistor P1 are approximately 4 microns or more. Additionally, adverse junction leakages can be completely eliminated if node X is not allowed to contact (i.e., electrically isolated from) any diffusion region that is placed in a well or substrate which is at a voltage level different than the high voltage level. In other words, all diffusion regions which are connected to node X are required to have their associated wells or substrates biased at the high voltage level.

The present invention also lends itself to minimizing the capacitance at node X, which improves the rate at which node X is charged to Vcc by the subthreshold current. The subthreshold current from PMOS transistor P1 is small, typically on the order of 1 picoamp (depending on transistor feature sizes and the process technology used to manufacture the transistor). Thus, if the capacitance at node X is kept small (e.g., at 25 femtofarads), the charging ramp rate at node X will be fast enough for most quick-start applications, i.e., the charging ramp rate (or time constant) will be 25 milliseconds/volt using the above numbers. However, if the capacitance at node X is large, e.g., 1 picofarad (typical of long signal lines), the charging ramp rate would slow to 1 second/volt, which in many applications would be considered an unacceptable delay for the circuit to resolve to its final state.

The capacitance at node X can be reduced by reducing the capacitance of the transistors connected to node X, i.e., PMOS transistor P2 and NMOS transistor N2. The capacitance of the transistors can be reduced by decreasing the gate load capacitance (plate area capacitance) and/or the drain or source load capacitance (edge length capacitance). If the driving circuit is an inverter, as shown in FIG. 2, the collective gate load capacitance at node X from the driver circuit can be reduced by decreasing the channel width and length of transistors P2 and N2. For example, the channel lengths of transistors P2 and N2 should be approximately 3 microns or less, and channel widths of transistors P2 and N2 should be approximately 1 micron or less, and thus, the combined gate area of transistors P2 and N2 at node X should be no more than 6 square microns. Note that while use of smaller transistors for the driving circuit increases the charging time of node Y, this time delay is negligible when compared with the time required to charge node X and can thus be ignored. In particular, the overall speed of the circuit is controlled by the speed at which node X charges, which is best optimized by minimizing the capacitance on node X.

Furthermore, although it is desirable to have a small capacitance at node X, no such limitation exists at node Y. Since the CMOS inverter can quickly charge and discharge large capacitive loads, output node Y may be connected to a large fan-out load for driving a large number of parallel loads.

Figure 3:
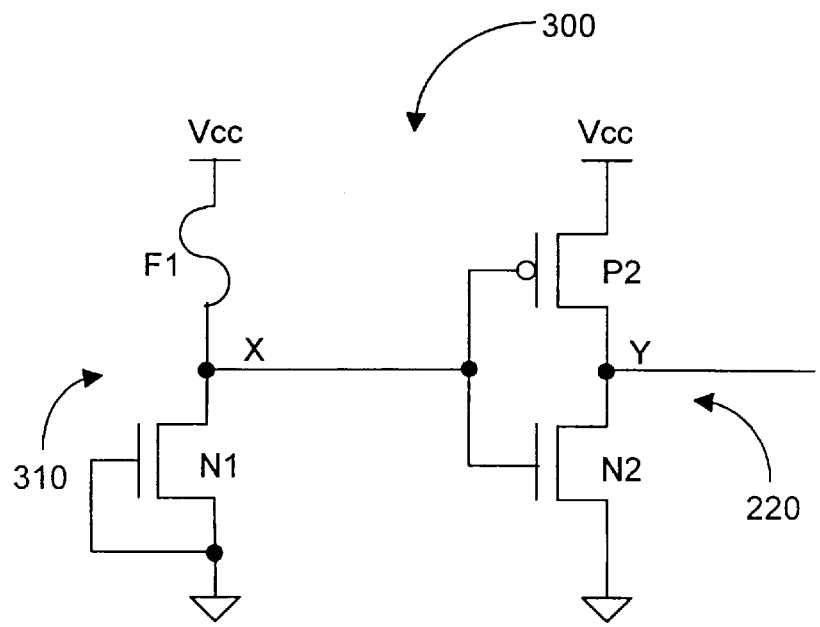
FIG. 3 is a diagram of a fuse circuit using an NMOS diode in accordance with another embodiment of the present invention.

For some process technologies, the fuse circuit may be optimized by using an n-channel device for the diode instead of a p-channel device, as shown in FIG. 3. Fuse circuit 300 includes a diode/fuse circuit 310 formed from a fuse F1 connected in series to an NMOS transistor N1, with the output of diode circuit 310 (at the common node of fuse F1 and transistor N1) coupled to the input of inverter 220. Contrary to the structure of FIG. 2, if fuse F1 is blown, node X is pulled down to a low logic level or ground, and if fuse F1 is retained, node X is pulled up to a high logic level or Vcc. This scheme is preferred if the specific wafer processing technology results in n-channel MOS devices with higher subthreshold currents than those of p-channel MOS devices.

Figure 4:
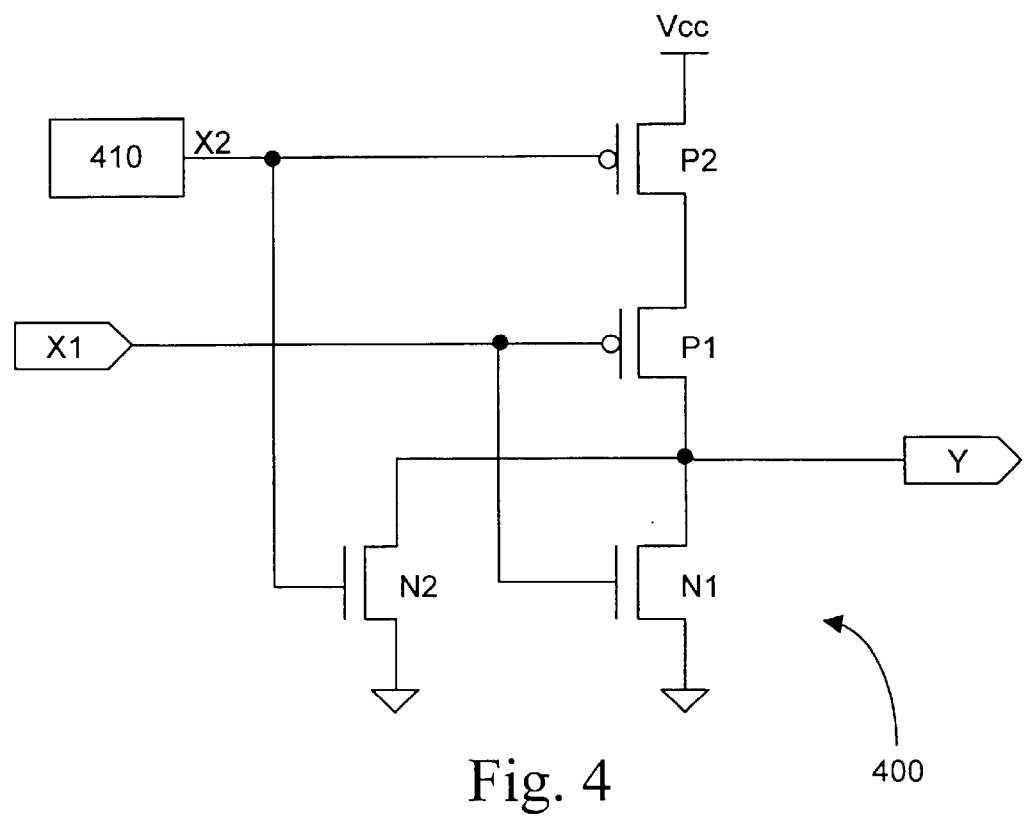
FIG. 4 is a diagram of a fuse circuit using a NOR driving circuit in accordance with another embodiment of the invention.

In other embodiments, inverter 220 of FIG. 2 can be replaced with other types of driving circuits, such as a NOR gate or a NAND gate. In FIG. 4, a fuse circuit 400 includes a diode/fuse circuit 410, which can be implemented, for example, with diode/fuse circuit 210 of FIG. 2 or diode/fuse circuit 310 of FIG. 3. The output of diode/fuse circuit 410 and a logic input X1 are input to a CMOS NOR circuit formed from two PMOS transistors P1 and P2 and two NMOS transistors N1 and N2. The output of the NOR circuit, at node Y, will be high (logic '1' or Vcc) only if the value at both nodes X1 and X2 are low (logic '0' or ground), which turns on both PMOS transistors P1 and P2. Thus, depending on the logic level of diode/fuse circuit 410 when the fuse is blown or not blown, output node Y will either be a fixed logic '0' level or an inverted version of input node X1. The transistor sizing requirements that apply to transistors N2 and P2 of FIG. 3 would in like fashion apply to transistors N2 and P2 of FIG. 4 as these transistors present the capacitive load on node X2 corresponding to the load of the inverter in FIG. 3.

Figure 1A:
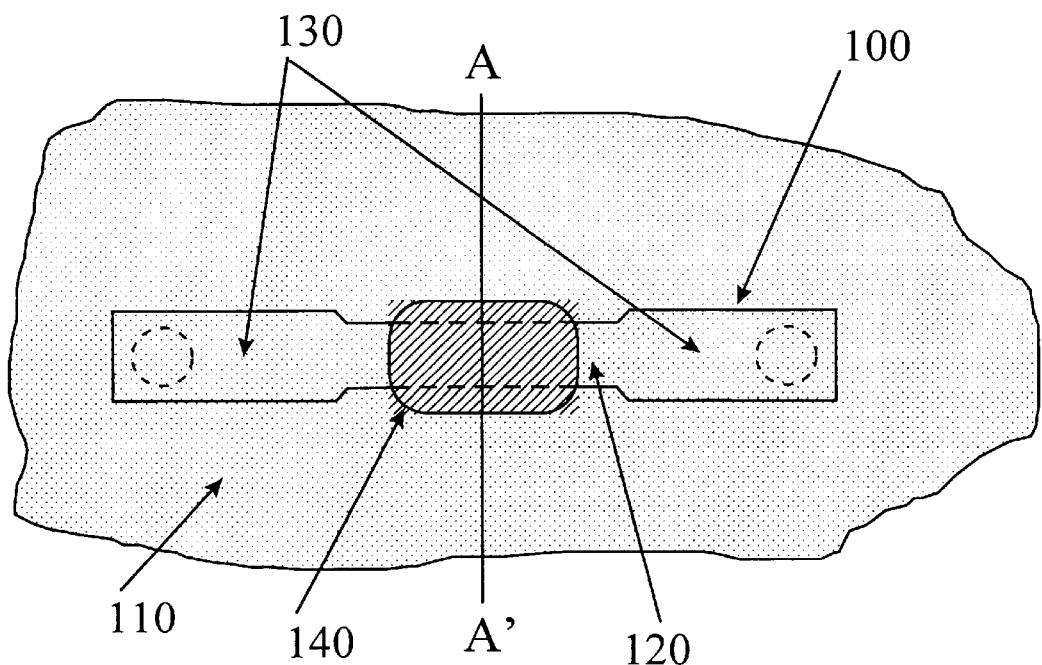
FIG. 1A is a top view of laser-configured fuse prior to lasering.
Figure 1B:
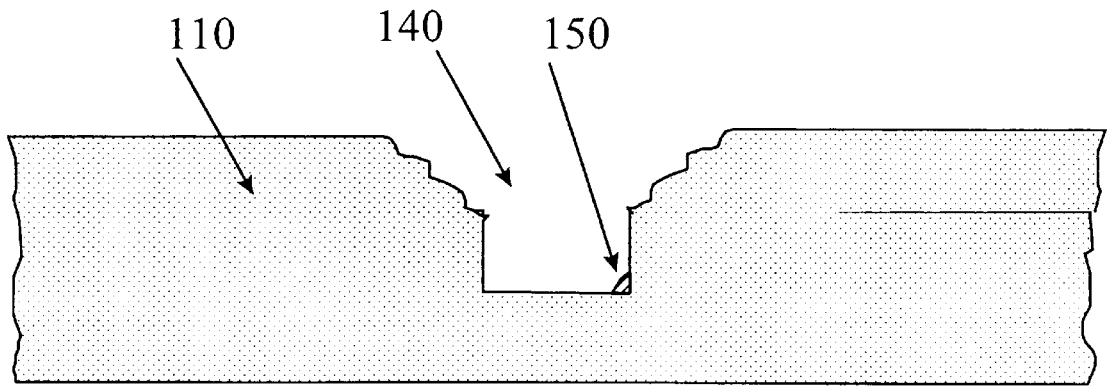
FIG. 1B is a cross-sectional view of the device of FIG. 1A along sectional lines A-A' after lasering in the case where the fuse is poorly blown.
Figure 5:
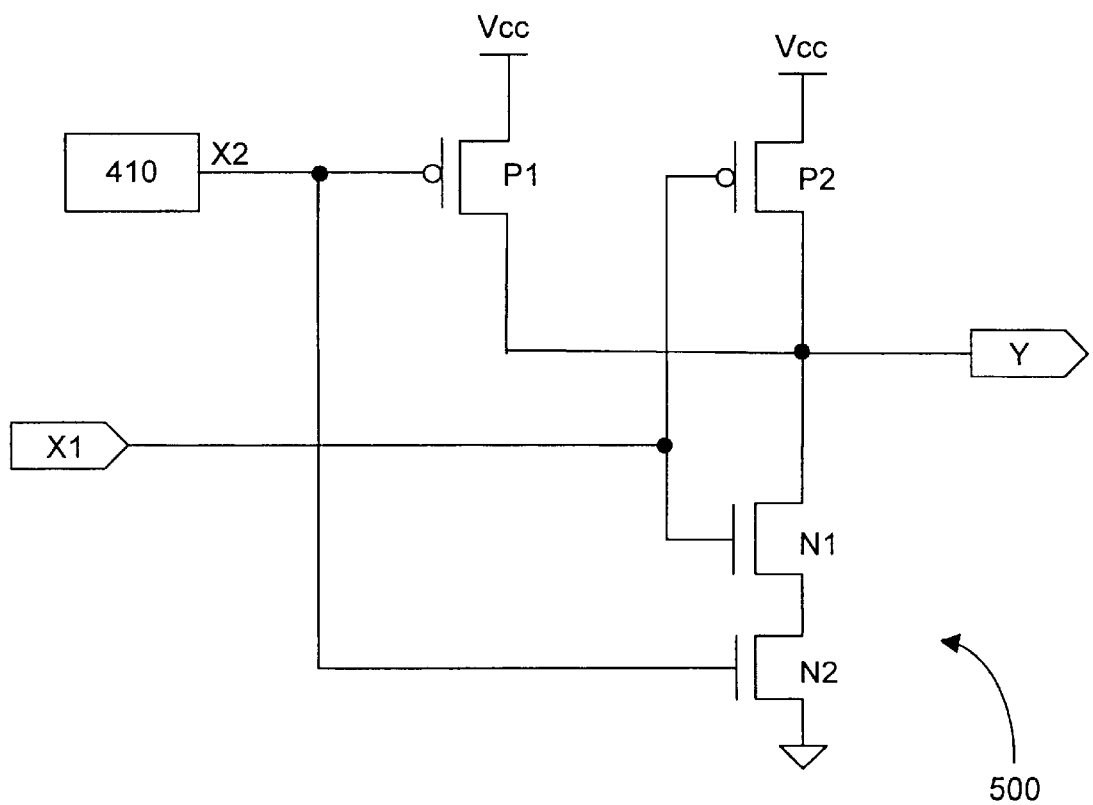
FIG. 5 is a diagram of a fuse circuit using a NAND driving circuit in accordance with another embodiment of the invention.

FIG. 5 shows another embodiment of a fuse circuit 500, which utilizes a CMOS NAND circuit as the driving circuit. Similar to the NOR circuit, the NAND circuit is comprised of two NMOS transistors N1 and N2 and two PMOS transistors P1 and P2, which accepts inputs from node X2 of diode/fuse circuit 410 and node X1 which is a logic input to the circuit 500. However, unlike the NOR circuit, the output at node Y will be low only if the value at both nodes X1 and X2 are high, which turns on both NMOS transistors N1 and N2. Again, depending on the logic level of diode/fuse circuit 410 when the fuse is blown or not blown, either a fixed logic '1' level or an inverted version of input X1 will appear at output node Y. Note that the concepts described above with respect to the capacitance and subthreshold current associated with node X and transistor P1 of FIG. 1 apply similarly to the capacitance at node X2 and to the subthreshold current from diode/fuse circuit 410.

As a result, zero static power fuse circuits according the present invention require less circuit layout area than other similar fuse circuits, such as those disclosed in Jiang, referenced above. In Jiang, the fuse circuit requires two fuses to implement, as opposed to only one fuse in this invention. Furthermore, additional drive transistors must be added to the basic fuse circuit of Jiang to drive high capacitance nodes in reasonable time, which adds to the area cost of the circuit. If the fuse circuit disclosed in Jiang is connected directly to a high capacitance output node without some type of additional drive transistors added, the long time delay for the subthreshold current to charge this node may be unacceptable in many applications.

In addition, the fuse circuits of FIGS. 2 and 3 also utilize less circuit area than the fuse circuit disclosed by Pathak et al., referenced above, which uses an additional capacitor. The large capacitance of the input node precludes the use of the fuse circuit in quick-start applications unless connected to another circuit through additional 'momentary contact' schemes involving additional circuit elements, which increases area of the resulting device.

The above-described embodiments of the present invention are merely meant to be illustrative and not limiting. It will thus be obvious to those skilled in the art that various changes and modifications may be made without departing from this invention in its broader aspects. For example, the above description illustrates some embodiments of diode/fuse circuits and driving circuits. However, other suitable implementations of such circuits according to the present invention are also possible for use with other fuse structures. Therefore, the appended claims encompass all such changes and modifications as fall within the true spirit and scope of this invention.

What is claimed is:

1. A configurable fuse circuit, comprising:
    a reverse-biased MOS transistor having a gate, a source, and a drain, wherein said source and said gate are coupled together to a first potential;
    a fuse having first and second terminals, wherein said first terminal is coupled to said drain of said MOS transistor at a node X, wherein the only source or drain coupled to said node X is the drain of said MOS transistor, and said second terminal is coupled to a second potential; and
    a driving circuit having an input node and an output node Y, wherein said input node is coupled to said node X.

2. The fuse circuit of claim 1, wherein a subthreshold conduction current flows to said node X including when said fuse is blown.

3. The fuse circuit of claim 1, wherein said driving circuit comprises:
    a PMOS transistor having a gate, a source, and a drain; and
    an NMOS transistor having a gate, a source, and a drain, wherein the gates of said PMOS and NMOS transistors are coupled together to said node X, and the drains of said PMOS and NMOS transistors are coupled together to said node Y.

4. The fuse circuit of claim 1, wherein said driving circuit is an inverter.

5. The fuse circuit of claim 3, wherein said driving circuit is a CMOS inverter.

6. The fuse circuit of claim 5, wherein the source of said PMOS transistor is coupled to a supply voltage, and wherein the source of said NMOS transistor is coupled to a ground potential.

7. The fuse circuit of claim 5, wherein the channel width and length of said PMOS transistor is approximately equal to or less than 1 micron and 3 microns, respectively.

8. The fuse circuit of claim 5, wherein the channel width and length of said NMOS transistor is approximately equal to or less than 1 micron and 3 microns, respectively.

9. The fuse circuit of claim 3, wherein said reverse-biased MOS transistor is a p-channel transistor, and wherein said first potential is a supply voltage and said second potential is approximately 0 volts.

10. The fuse circuit of claim 9, wherein the channel length of said reverse-biased MOS transistor is shorter than the channel length of said PMOS transistor in said driving circuit.

11. The fuse circuit of claim 9, wherein the channel width of said reverse-biased MOS transistor is wider than the channel width of said PMOS transistor in said driving circuit.

12. The fuse circuit of claim 3, wherein said reverse-biased MOS transistor is an n-channel transistor, and wherein said first potential is approximately 0 volts and said second potential is a supply voltage.

13. The fuse circuit of claim 12, wherein the channel length of said reverse-biased MOS transistor is shorter than the channel length of said NMOS transistor in said driving circuit.

14. The fuse circuit of claim 12, wherein the channel width of said reverse-biased MOS transistor is wider than the channel width of said NMOS transistor in said driving circuit.

15. The fuse circuit of claim 1,
wherein said driving circuit has a second input node coupled to a node X1, wherein said node X1 is a logic input.

16. The fuse circuit of claim 15, wherein said driving circuit is a NOR gate.

17. The fuse circuit of claim 15, wherein said driving circuit is a NAND gate.

18. The fuse circuit of claim 1, wherein said node X is electrically isolated from any diffusion area which is placed in a well or substrate at a potential other than said first potential.

19. The fuse circuit of claim 1, wherein the channel length of said reverse-biased MOS transistor is the minimum allowed by process design rules.

20. The fuse circuit of claim 1, wherein said reverse-biased MOS transistor has a channel width equal to or greater than approximately 4 microns.

21. The fuse circuit of claim 1, wherein said driving circuit comprises a plurality of transistors, and wherein the cumulative gate area of each of said plurality of transistors having an associated gate terminal connected to said node X is less than or equal approximately 6 square microns.

22. A configurable fuse circuit, comprising:
a first MOS transistor, wherein the source and the gate of said first MOS transistor are coupled together to a first potential;
a fuse having first and second terminals, wherein said first terminal is coupled to the drain of said first MOS transistor at a node X, wherein the only source or drain coupled to said node X is the drain of said first MOS transistor, and said second terminal is coupled to a second potential;
a second MOS transistor, wherein the gate and the source of said second MOS transistor is coupled to said node X and to a third potential, respectively; and
a third MOS transistor, wherein the gate and the source of said third MOS transistor is coupled to said node X and to a fourth potential, respectively, and wherein the drains of said second and third MOS transistors are coupled together at an output node Y.

23. The fuse circuit of claim 22, wherein said first MOS transistor is a PMOS transistor, and wherein said first and second potentials are a supply voltage and ground, respectively.

24. The fuse circuit of claim 22, wherein said first MOS transistor is an NMOS transistor, and wherein said first and second potentials are ground and a supply voltage, respectively.

25. The fuse circuit of claim 22, wherein said second and third MOS transistors are a PMOS and an NMOS transistor, respectively, and wherein said third and fourth potentials are a supply voltage and ground, respectively.

26. The fuse circuit of claim 22, wherein a subthreshold conduction current flows to said node X including when said fuse is blown.

* * * * *